(12) United States Patent
Bathan et al.

(10) Patent No.: US 7,977,579 B2
(45) Date of Patent: Jul. 12, 2011

(54) MULTIPLE FLIP-CHIP INTEGRATED CIRCUIT PACKAGE SYSTEM

(75) Inventors: Henry D. Bathan, Singapore (SG); Zigmund Ramirez Camacho, Jr., Singapore (SG); Arnel Trasporto, Singapore (SG); Jeffrey D. Punzalan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 12 days.

(21) Appl. No.: 11/278,070

(22) Filed: Mar. 30, 2006

(65) Prior Publication Data
US 2007/0235215 A1  Oct. 11, 2007

(51) Int. Cl.
*H05K 1/16* (2006.01)

(52) U.S. Cl. ............... 174/260; 29/832; 257/686

(58) Field of Classification Search .......... 174/260; 257/778, 686; 29/832, 854
See application file for complete search history.

(56) References Cited

U.S. PATENT DOCUMENTS

| | | | | |
|---|---|---|---|---|
| 4,976,626 A | * | 12/1990 | Dibble et al. | 439/67 |
| 5,311,059 A | * | 5/1994 | Banerji et al. | 257/778 |
| 5,538,433 A | * | 7/1996 | Arisaka | 439/70 |
| 5,587,341 A | | 12/1996 | Masayuki et al. | |
| 5,780,776 A | * | 7/1998 | Noda | 174/255 |
| 5,787,575 A | * | 8/1998 | Banerjee et al. | 29/832 |
| 6,121,679 A | * | 9/2000 | Luvara et al. | 257/700 |
| 6,492,726 B1 | * | 12/2002 | Quek et al. | 257/723 |
| 6,599,779 B2 | * | 7/2003 | Shim et al. | 438/122 |
| 6,674,159 B1 | * | 1/2004 | Peterson et al. | 257/680 |
| 6,732,428 B1 | * | 5/2004 | Kwong | 29/832 |
| 6,768,190 B2 | | 7/2004 | Yang et al. | |
| 6,790,056 B2 | * | 9/2004 | Buondelmonte et al. | 439/83 |
| 6,861,761 B2 | | 3/2005 | Yang et al. | |
| 6,879,031 B2 | * | 4/2005 | Wang | 257/686 |
| 6,890,798 B2 | * | 5/2005 | McMahon | 438/122 |
| 6,919,220 B2 | * | 7/2005 | Akram | 438/106 |
| 6,921,968 B2 | | 7/2005 | Chung | |
| 6,949,413 B2 | * | 9/2005 | Lo et al. | 438/122 |
| 7,259,450 B2 | * | 8/2007 | Wood et al. | 257/685 |
| 2002/0066592 A1 | * | 6/2002 | Cheng | 174/260 |
| 2005/0189140 A1 | * | 9/2005 | Tseng | 174/260 |
| 2006/0027902 A1 | | 2/2006 | Ararao et al. | |

* cited by examiner

*Primary Examiner* — Ishwarbhai B Patel
(74) *Attorney, Agent, or Firm* — Mikio Ishimaru

(57) ABSTRACT

An integrated circuit package system includes forming a multi-tier substrate, and attaching a plurality of integrated circuits on the multi-tier substrate.

20 Claims, 3 Drawing Sheets

MULTIPLE FLIP-CHIP INTEGRATED CIRCUIT PACKAGE SYSTEM

TECHNICAL FIELD

The present invention relates generally to package systems, and more particularly to a system for integrated circuit packages.

BACKGROUND ART

Integrated circuit devices are constructed from a wafer through a process that comprises a number of deposition, masking, diffusion, etching, and implanting steps. Usually, many individual devices are constructed on the same wafer. When the devices are separated into individual rectangular units, each takes the form of an integrated circuit die. In order to interface a die with other circuitry, it is common to mount it in a package with several interconnect. Each die has connections that are then individually connected in to the package interconnect to connect the die to a next level system such as a printed circuit board. The assemblies are then packaged by individually encapsulating them in molded plastic or ceramic covers.

Across virtually all applications, there continues to be growing demand for reducing size and increasing performance of integrated circuits. The seemingly endless restrictions and requirements are no more visible than with products in our daily lives. Smaller and denser integrated circuits are required in many portable electronic products, such as cell phones, portable computers, voice recorders, etc. as well as in many larger electronic systems, such as cars, planes, industrial control systems, etc. As the demand grows for smaller electronic products with more features, manufacturers are seeking ways to include more features as well as reduce the size of the integrated circuit packages. To meet these needs, packaging technologies are increasingly using smaller form factors with more circuits.

Wafer manufacturers strive to reduce transistor or capacitor feature size in order to increase circuit density and enhance functionality. Device geometries with sub-micron line widths are so common that individual chips routinely contain millions of electronic devices. Reduced feature size has been quite successful in improving electronic systems, and continuous development is expected in the future. However, significant obstacles to further reduction in feature size are being encountered. These obstacles include defect density control, optical system resolution limits, and availability of processing material and equipment. Attention has therefore increasingly shifted to integrated circuit packaging as a means to fulfill the relentless demands for enhanced system performance.

To condense further the packaging of individual devices, multi-chip packages have been developed in which more than one device, such as an integrated circuit die, can be included in the same package. Of importance to such complicated packaging designs are considerations of input/output lead count, heat dissipation, matching of thermal expansion and contraction between a motherboard and its attached components, costs of manufacturing, ease of integration into an automated manufacturing facility, package reliability, and easy adaptability of the package to additional packaging interfaces such as a printed circuit board.

Drawbacks of conventional designs include a relatively large footprint of the package on the mounting surface of motherboard. The footprint typically reflects the maximum planar dimension of the package, namely, the x-y dimension of the package. In applications where mounting space is at a premium, such as pagers, portable telephones, and personal computers, among others, a large footprint is undesirable at best. With the goal of increasing the amount of circuitry in a package without increasing the area of the package, so that the package does not take up any more space on the circuit board, manufacturers have been stacking two or more die within a single package. Unfortunately, stacking flipchip integrated circuits requires inefficient wirebonding or redistribution layer interfaces.

Thus, a need still remains for an integrated circuit package system to provide improved function, area, volume, and manufacturing yield. In view of the increasing demand for improved integrated circuits and particularly more functions in smaller products at lower costs, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides forming a multi-tier substrate having a plurality of tiers, and attaching connectors of a plurality of integrated circuits on the plurality of tiers.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
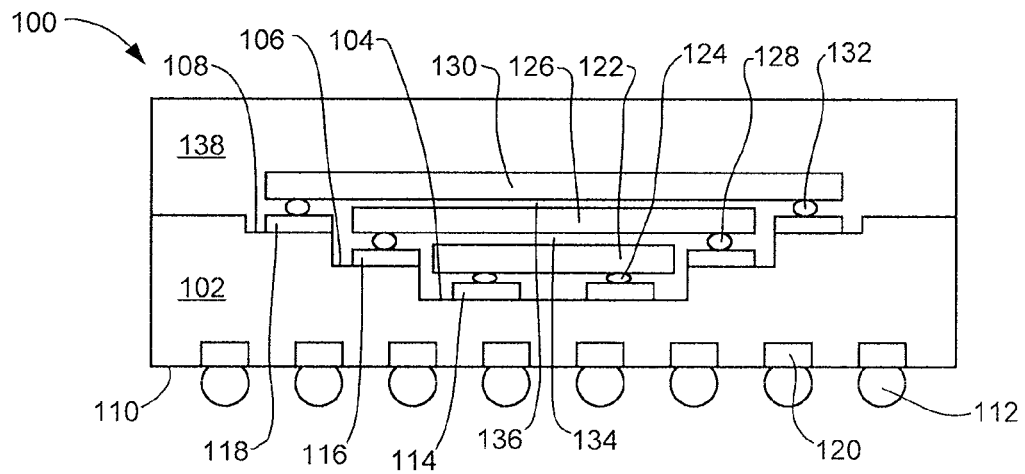
FIG. 1 is a cross-sectional view of an integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known circuits, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGs. Similarly, although the sectional views in the drawings for ease of description show the invention with surfaces as oriented downward, this arrangement in the FIGs. is arbitrary and is not intended to suggest that invention should necessarily be in a downward direction. Generally, the device can be operated in any orientation. In addition, the same numbers are used in all the drawing FIGs. to relate to the same elements.

The term "horizontal" as used herein is defined as a plane parallel to the conventional plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "on" refers to direct contact among the elements.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit package system 100 in an embodiment of the present invention. The integrated circuit package system 100 includes a multi-tier substrate 102, such as a bismaleimide triazine (BT) laminate substrate. The multi-tier substrate 102 includes a bottom tier 104, a middle tier 106 and a top tier 108 and a base 110 having substrate connectors 112, such as solder balls in a ball grid array (BGA). The substrate connectors 112 can provide electrical connection to a next level system, such as a printed circuit board. The bottom tier 104 can include bottom pads 114 for electrical connectivity to the multi-tier substrate 102. In a similar manner, the middle tier 106 can includes middle pads 116, and the top tier 108 can include top pads 118. The base 110 can also include substrate pads 120.

The integrated circuit package system 100 also includes a bottom integrated circuit 122, such as a flip chip integrated circuit, with bottom connectors 124, such as solder bumps. A connection process, such as reflow, connects the bottom connectors 124 to the bottom pads 114. In a similar manner, the integrated circuit package system 100 includes a middle integrated circuit 126, such as a flip chip integrated circuit, with middle connectors 128. A Connection process, such as reflow, connects the middle connectors 128 to the middle pads 116. The pads 114, 116, and 118 are termed "raised pads" because the tops of the pads are raised above the tier upon which they are formed and have a thickness comparable to the thickness of their respective connectors 124, 128, and 132. The bottom integrated circuit 122 is horizontally nested within the middle pads 116. A first layer 134, such as an epoxy mold compound, can be formed between the bottom integrated circuit 122 and the middle integrated circuit 126. As an option, the first layer 134 can be an underfill or adhesive material.

Similarly, the integrated circuit package system 100 includes a top integrated circuit 130, such as a flip chip integrated circuit, with top connectors 132. A connection process, such as reflow, connects the top connectors 132 to the top pads 118. The middle integrated circuit 126 is horizontally nested within the top pads 118. A second layer 136, such as an epoxy mold compound, can be formed between the middle integrated circuit 126 and the top integrated circuit 130. As an option, the second layer 136 can be an underfill or adhesive material. The top integrated circuit 130 can be connected to any or all of the middle integrated circuit 126, the bottom integrated circuit 122, and the substrate connectors 112 through the multi-tier substrate 102.

An encapsulant 138, such as an epoxy mold compound, covers and underfills, or coats the undersides of, at least the bottoms of the bottom integrated circuit 122, the middle integrated circuit 126, and the top integrated circuit 130 adjacent their respective pads, and part of the top of the multi-tier substrate 102. For illustrative purposes, three mounting surfaces are shown although it is understood that any number of mounting surfaces may be provided. Further, for illustrative purposes, the tiers are shown with increasing height and width although it is understood that each of the tiers may be configured differently with height and width varying independently.

Figure 2:
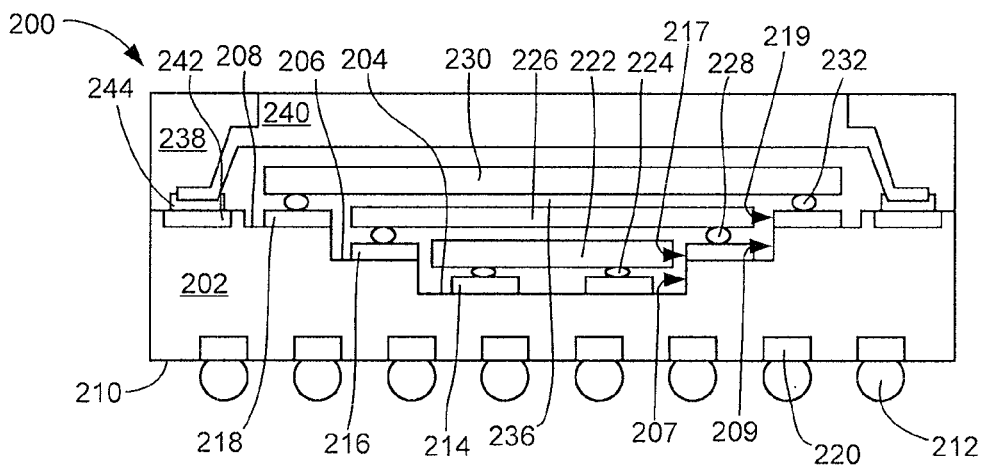
FIG. 2 is a cross-sectional view of an integrated circuit package system in an alternative embodiment of the present invention.

Referring now to FIG. 2, therein is shown a cross-sectional view of an integrated circuit package system 200 in an alternative embodiment of the present invention. In a manner similar to the integrated circuit package system 100 of FIG. 1, the integrated circuit package system 200 includes a multi-tier substrate 202, such as a bismaleimide triazine (BT) laminate substrate. The multi-tier substrate 202 includes a bottom tier 204, a middle tier 206 and a top tier 208 and a base 210 having substrate connectors 212, such as solder balls in a ball grid array (BGA). The substrate connectors 212 can provide electrical connection to a next level system, such as a printed circuit board. The bottom tier 204 can include bottom pads 214 for electrical connectivity to the multi-tier substrate 202. In a similar manner, the middle tier 206 can includes middle pads 216, and the top tier 208 can include top pads 218. The base 210 can also include substrate pads 220. The middle tier 206 can have a middle tier vertical side 207. The middle pads 216 can have a middle pad vertical side 217. The middle pad vertical side 217 of the middle pads 216 can be coplanar with the middle tier vertical side 207 of the middle tier 206. The top tier 208 can have a top tier vertical side 209. The top pads 218 can have a top pad vertical side 219. The ton pad vertical side 219 of the top pads 218 can be coplanar with the to tier vertical side 209 of the ton tier 208.

The integrated circuit package system 200 also includes a bottom integrated circuit 222, such as a flip chip integrated circuit, with bottom connectors 224, such as solder bumps. A connection process, such as reflow, connects the bottom connectors 224 to the bottom pads 214. In a similar manner, the integrated circuit package system 200 includes a middle integrated circuit 226, such as a flip chip integrated circuit, with middle connectors 228. A connection process, such as reflow, connects the middle connectors 228 to the middle pads 216. The bottom pads 214, the middle pads 216, and the top pads 218 are termed "raised pads" because the tops of each of the pads are raised above the bottom tier 204, the middle tier 206, and the top tier 208 tier upon which they are respectively formed. The bottom integrated circuit 122 is horizontally nested within the middle pads 116. A first layer 234, such as an epoxy mold compound, can be formed between the bottom integrated circuit 222 and the middle integrated circuit 226. As an option, the first layer 234 can be an underfill or adhesive material.

Similarly, the integrated circuit package system 200 includes a top integrated circuit 230, such as a flip chip integrated circuit, with top connectors 232. A connection process, such as reflow, connects the top connectors 232 to the top pads 218. The middle integrated circuit 226 is horizontally nested within the top pads 218. A second layer 236, such as an epoxy mold compound, can be formed between the middle integrated circuit 226 and the top integrated circuit 230. As an option, the second layer 236 can be an underfill or adhesive material. The top integrated circuit 230 can be connected to any or all of the middle integrated circuit 226, the bottom integrated circuit 222, and the substrate connectors 212 through the multi-tier substrate 202.

A heatsink 240 can be attached over the bottom integrated circuit 222, the middle integrated circuit 226, and the top integrated circuit 230 for dissipating heat from the integrated circuit package system 200. The heatsink 240 can be mounted on substrate pads 242 with a substrate connection material 244. The substrate connection material 244 can be non-conductive, such as an insulating adhesive, or conductive, such as solder. As an option, the heatsink 240 can be grounded through conductive materials for the substrate connection material 244, such as solder, and the substrate pads 242 connected to a ground level trace or plane.

An encapsulant 238, such as an epoxy mold compound, covers the bottom integrated circuit 222, the middle integrated circuit 226, the top integrated circuit 230, and part of the multi-tier substrate 202. For illustrative purposes, three mounting surfaces are shown although it is understood that any number of mounting surfaces may be provided. Further, for illustrative purposes, the tiers are shown with increasing height and width although it is understood that each of the tiers may be configured differently with height and width varying independently.

Figure 3:
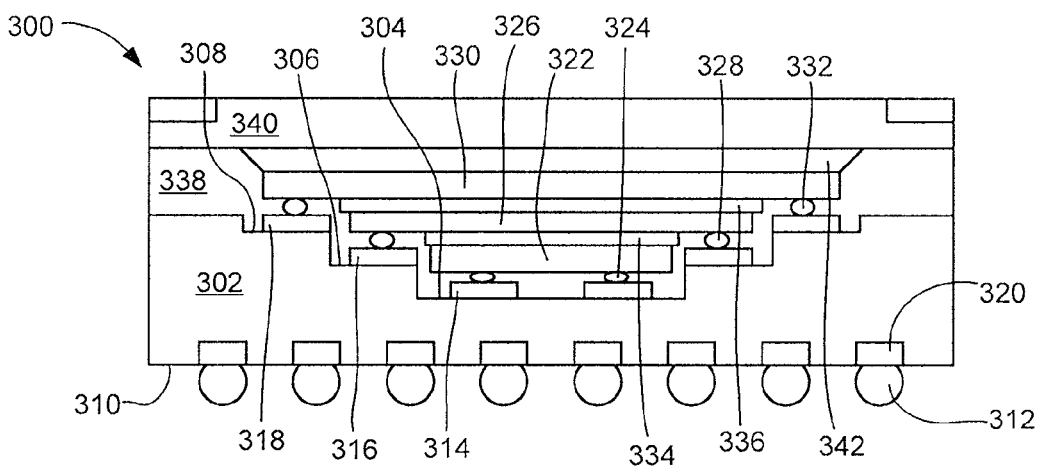
FIG. 3 is a cross-sectional view of an integrated circuit package system in another alternative embodiment of the present invention.

Referring now to FIG. 3, therein is shown a cross-sectional view of an integrated circuit package system 300 in another alternative embodiment of the present invention. In a manner similar to the integrated circuit package system 100 of FIG. 1, the integrated circuit package system 300 includes a multi-tier substrate 302, such as a bismaleimide triazine (BT) laminate substrate. The multi-tier substrate 302 includes a bottom tier 304, a middle tier 306 and a top tier 308 and a base 310 having substrate connectors 312, such as solder balls in a ball grid array (BGA). The substrate connectors 312 can provide electrical connection to a next level system, such as a printed circuit board. The bottom tier 304 can include bottom pads 314 for electrical connectivity to the multi-tier substrate 302. In a similar manner, the middle tier 306 can includes middle pads 316, and the top tier 308 can include top pads 318. The base 310 can also include substrate pads 320.

The integrated circuit package system 300 also includes a bottom integrated circuit 322, such as a flip chip integrated circuit, with bottom connectors 324, such as solder bumps. A connection process, such as reflow, connects the bottom connectors 324 to the bottom pads 314. In a similar manner, the integrated circuit package system 300 includes a middle integrated circuit 326, such as a flip chip integrated circuit, with middle connectors 328. A connection process, such as reflow, connects the middle connectors 328 to the middle pads 316. A first die attach adhesive 334 is formed between the bottom integrated circuit 322 and the middle integrated circuit 326. The first die attach adhesive 334 provides low stress, low elastic modulus, and high thermal conductivity between the bottom integrated circuit 322 and the middle integrated circuit 326.

Similarly, the integrated circuit package system 300 includes a top integrated circuit 330, such as a flip chip integrated circuit, with top connectors 332. A connection process, such as reflow, connects the top connectors 332 to the top pads 318. A second die attach adhesive 336 is formed between the middle integrated circuit 326 and the top integrated circuit 330. The second die attach adhesive 336 provides low stress, low elastic modulus, and high thermal conductivity between the middle integrated circuit 326 and the top integrated circuit 330. The top integrated circuit 330 can be connected to any or all of the middle integrated circuit 326, the bottom integrated circuit 322, and the substrate connectors 312 through the multi-tier substrate 302.

A heatsink 340 can be attached over the bottom integrated circuit 322, the middle integrated circuit 326, and the top integrated circuit 330 for dissipating heat from the integrated circuit package system 300. The heatsink 340 is mounted on the top integrated circuit 330 with a third die attach adhesive 342. The third die attach adhesive 342 provides low stress, low elastic modulus, and high thermal conductivity between the heatsink 340 and the top integrated circuit 330.

An encapsulant 338, such as an epoxy mold compound, covers the bottom integrated circuit 322, the middle integrated circuit 326, the top integrated circuit 330, and part of the multi-tier substrate 302. For illustrative purposes, three mounting surfaces are shown although it is understood that any number of mounting surfaces may be provided. Further, for illustrative purposes, the tiers are shown with increasing height and width although it is understood that each of the tiers may be configured differently with height and width varying independently.

Figure 4:
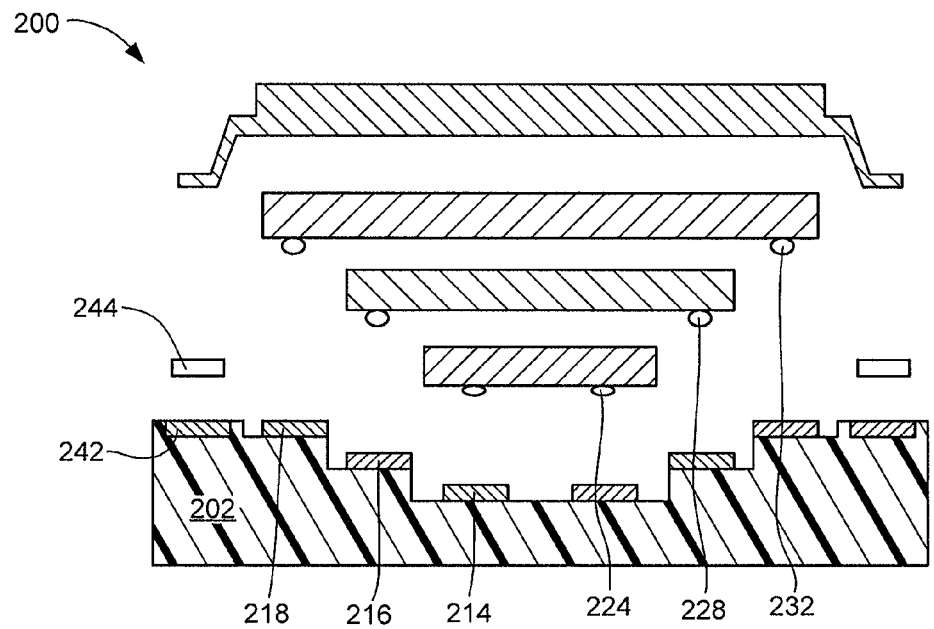
FIG. 4 is a cross-sectional view of the integrated circuit package system in an attaching phase.

Referring now to FIG. 4, therein is shown a cross-sectional view of the integrated circuit package system 200 in an attaching phase. The bottom integrated circuit 222, the middle integrated circuit, and the top integrated circuit 230 attach to the multi-tier substrate 202. The bottom connectors 224 of the bottom integrated circuit 222 connect to the bottom pads 214, the middle connectors 228 of the middle integrated circuit 226 connect to the middle pads 216, and the top connectors 232 of the top integrated circuit 230 connect to the top pads 218.

As an option, a connection process, such as reflow, can be applied simultaneously to the bottom connectors 224, the middle connectors 228, and the top connectors 232. As another option, a first connection process, such as reflow, can be applied to the bottom connectors 224, a second connection process, such as reflow, can be applied to the middle connectors 228, and a third connections process, such as reflow, can be applied to the top connectors 232. The heatsink 240 attaches to the multi-tier substrate 202 with the substrate connection material 244.

An optional under fill process can apply the first layer 234 of FIG. 2 between the bottom integrated circuit 222 and the middle integrated circuit 226. Similarly, the optional under fill process can apply the second layer 236 of FIG. 2 between the middle integrated circuit 226 and the top integrated circuit 230. A molding process can apply the encapsulant 238 of FIG. 2 over the bottom integrated circuit 222, the middle integrated circuit, the top integrated circuit 230, and part of the multi-tier substrate 202.

Figure 5:
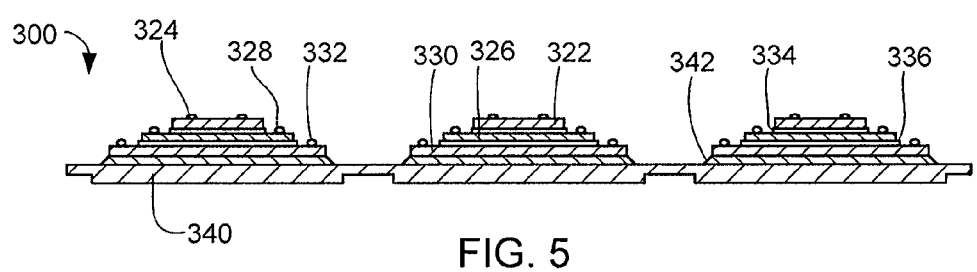
FIG. 5 is a cross-sectional view of the integrated circuit package system in a heatsink attaching phase.

Referring now to FIG. 5, therein is shown a cross-sectional view of the integrated circuit package system 300 in a heatsink attaching phase. The third die attach adhesive 342 attaches a side opposite the top connectors 332 of the top integrated circuit 330 to the heatsink 340. The second die attach adhesive 336 attaches a side opposite the middle connectors 328 of the middle integrated circuit 326 to a side having the top connectors 332 of the top integrated circuit 330. The first die attach adhesive 334 attaches a side opposite the bottom connectors 324 of the bottom integrated circuit 322 to a side having the middle connectors 328 of the middle integrated circuit 326. The bottom integrated circuit 322, the middle integrated circuit 326, and the top integrated circuit 330 are mounting have the bottom connectors 324, the middle connectors 328, and the top connectors 332 on a side opposite the heatsink 340.

For illustrative purposes, three sets of the integrated circuit package system 300 in the heatsink attaching phase are shown although it is understood that any number of the integrated circuit package system 300 in the heatsink attaching phase may be formed together.

Figure 6:
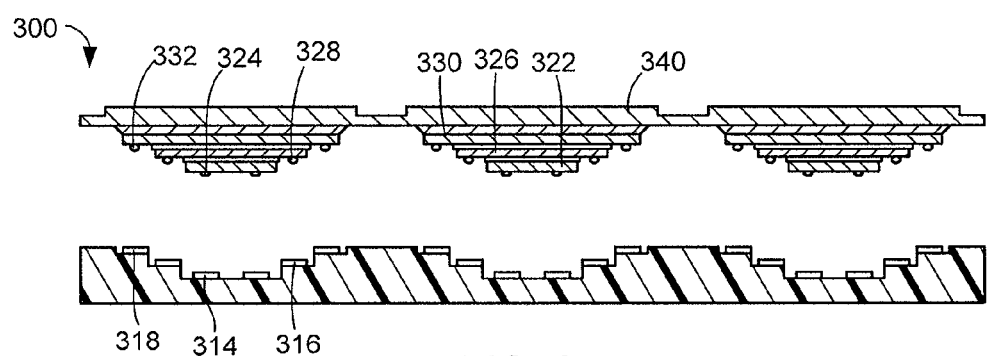
FIG. 6 is a cross-sectional view of the integrated circuit package system in a chip attaching phase.

Referring now to FIG. 6, therein is shown a cross-sectional view of the integrated circuit package system 300 in a chip attaching phase. The bottom integrated circuit 322, the middle integrated circuit 326, and the top integrated circuit 330 mounted on the heatsink 340 are attached to the multi-tier substrate 302. A side opposite the heatsink 340 of the bottom integrated circuit 322 having the bottom connectors 324 is attached to the bottom pads 314. In a similar manner, a side opposite the heatsink 340 of the middle integrated circuit 326 having the middle connectors 328 is attached to the middle pads 316. Similarly, a side opposite the heatsink 340 of the top integrated circuit 330 having the top connectors 332 is attached to the top pads 318. The heatsink 340 is on a side opposite the multi-tier substrate 302 of the top integrated circuit 330.

For illustrative purposes, three sets of the integrated circuit package system 300 in the chip attaching phase are shown although it is understood that any number of the integrated circuit package system 300 in the chip attaching phase may be formed together.

Figure 7:
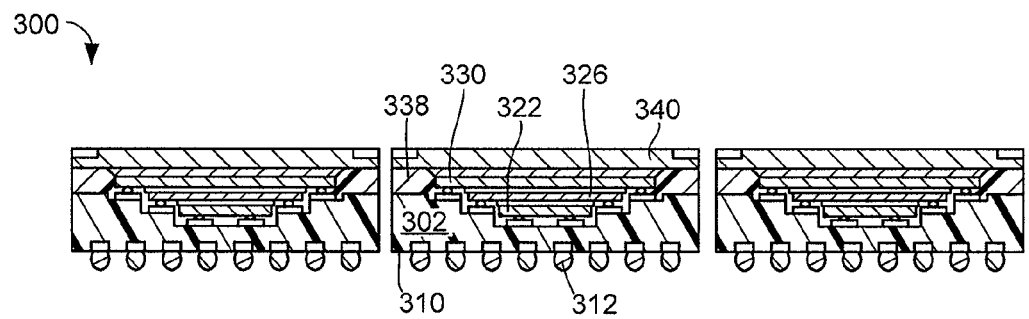
FIG. 7 is a cross-sectional view of the integrated circuit package system in a package forming phase.

Referring now to FIG. 7, therein is shown a cross-sectional view of the integrated circuit package system 300 in a package forming phase. The bottom integrated circuit 322, the middle integrated circuit 326, and the top integrated circuit 330 are attached to the multi-tier substrate 302. The heatsink 340 is attached on a side opposite the multi-tier substrate 302 of the top integrated circuit 330. The encapsulant 338 is applied over the bottom integrated circuit 322, the middle integrated circuit 326, the top integrated circuit 330, the heatsink 340, and part of the multi-tier substrate 302. The base 310 of the multi-tier substrate 302 includes the substrate connectors 312, such as solder balls in a ball grid array (BGA). The substrate connectors 312 can provide electrical connection to a next level system, such as a printed circuit board.

For illustrative purposes, three sets of the integrated circuit package system 300 in the package forming phase are shown although it is understood that any number of the integrated circuit package system 300 in the package forming phase may be formed together.

Figure 8:
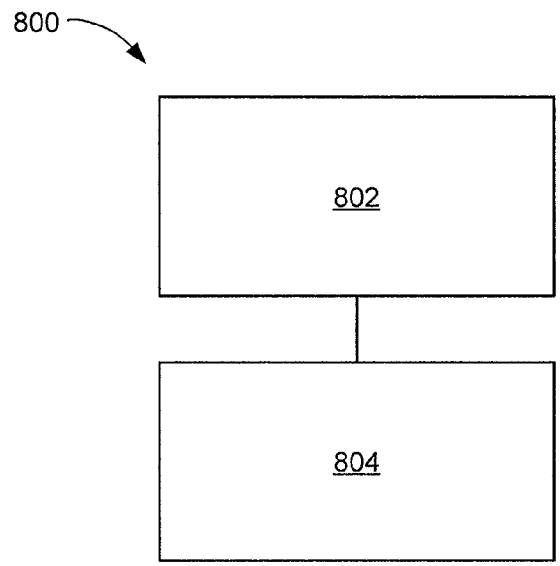
FIG. 8 is a flow chart of an integrated circuit package system for manufacturing the integrated circuit package system in an embodiment of the present invention.

Referring now to FIG. 8 is a flow chart of an integrated circuit package system 800 for manufacturing the integrated circuit package system 100 in an embodiment of the present invention. The system 800 includes forming a multi-tier substrate in a block 802; and attaching a plurality of integrated circuits on the multi-tier substrate in a block 804.

In greater detail, a method to fabricate the integrated circuit package system 100, in an embodiment of the present invention, is performed as follows:

1. Forming a multi-tier substrate having a plurality of tiers. (FIG. 1)
2. Attaching connectors of a plurality of integrated circuits on the plurality of tiers. (FIG. 1)

It has been discovered that the present invention thus has numerous aspects.

An aspect is that the present invention provides the multi-tier substrate. The multi-tier substrate provides multiple connection surfaces for multiple integrated circuits. The multiple connection surfaces or tiers are formed with different heights from the base of the multi-tier substrate as well as with different widths.

Another aspect is that the present invention provides the optional heatsink. The heatsink can be mounted directly over the integrated circuits and optionally grounded or the integrated circuits can be mounted directly on the heatsink. Both mounting configurations for the heatsink provide direct attachment to the multi-tier substrate or the integrated circuits.

It has been discovered that the disclosed structure integrates flipchip integrated circuits. The multiple connection surfaces allow direct attachment of multiple flipchip integrated circuits. The connection surfaces provide pads on the multi-tier substrate compatible with solder bumps on the flipchip integrated circuits.

It has also been discovered that the disclosed structure eliminates the need for bond wires. The direct attachment of multiple flipchip integrated circuits allows interconnection of the flipchip integrated circuits through the multi-tier substrate. The multi-tier substrate eliminates the need for bond wire interfaces to connect a second integrated circuit to a substrate.

Yet another discovery is that the disclosed structure eliminates the need for redistribution layers. The solder bumps on the flip chip integrated circuit directly attach to the connection surface of the multi-tier substrate. This compatibility of the connection surfaces with solder bumps eliminates the need for an interface layer such as the redistribution layer.

Yet another discovery is that the disclosed structure provides improved signal propagation. Bond wires and redistribution layers add signal parasitics that degrade signal propagation. Eliminated bond wires and redistribution layers allow the signals to travel directly through the multi-tier substrate, significantly improving quality of propagation.

Yet another discovery is that the disclosed structure is compatible with sensitive applications. The improved propagation and resulting signal quality provide a compatible environment for sensitive signals. The sensitive signals can propagate or transmit with improved signal quality allowing successful operation of sensitive applications.

Yet another discovery of the disclosed structure is improved thermal performance. The direct attachment of the heatsink to the multi-tier substrate and particularly the integrated circuits provides significantly improved thermal dissipation. This allows improved thermal performance for the integrated circuits and the system environment.

Yet another discovery of the disclosed structure is compatibility with high-power applications. The improved thermal performance allows the use of high-power devices and systems. Applications requiring high-power can use the significantly improved thermal dissipation to maintain optimal operating conditions.

These and other valuable aspects of the present invention consequently further the state of the technology to at least the next level.

Thus, it has been discovered that the integrated circuit package system method and apparatus of the present invention furnish important and heretofore unknown and unavailable solutions, capabilities, and functional aspects. The resulting processes and configurations are straightforward, cost-effective, uncomplicated, highly versatile, and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein

The invention claimed is:

1. A method of manufacture of an integrated circuit package system comprising:
 forming a multi-tier laminate substrate having raised pads on each tier and a pad vertical side of the raised pads coplanar with a tier vertical side of each tier; and
 attaching integrated circuits on the raised pads with each integrated circuit
 horizontally nested within the raised pads of the tier above.

2. The method as claimed in claim 1 wherein attaching the plurality of integrated circuits comprises attaching a plurality of flipchip integrated circuits.

3. The method as claimed in claim 1 wherein forming the multi-tier substrate comprises forming a tier of the multi-tier substrate having a height from a base of the multi-tier substrate and a width of a mounting surface, different from that of another tier.

4. The method as claimed in claim 1 further comprising attaching a structure on the multi-tier substrate over the plurality of integrated circuits with an encapsulant.

5. The method as claimed in claim 1 wherein forming a structure includes attaching each of the plurality of integrated circuits to another of the plurality of integrated circuits.

6. A method of manufacture of an integrated circuit package system comprising:
 forming a multi-tier laminate substrate having raised pads on each tier and a pad vertical side of the raised pads coplanar with a tier vertical side of each tier; and forming a heatsink conductively attached to raised pads in one of the tiers; and attaching of integrated circuits by connectors on the raised pads with each integrated circuit horizontally nested within the raised pads of the tier above.

7. The method as claimed in claim 6 wherein attaching the connectors comprises attaching solder bumps of a plurality of flipchip integrated circuits.

8. The method as claimed in claim 6 wherein forming the multi-tier substrate comprises forming the plurality of tiers having a height from a base of the multi-tier substrate and width of a mounting surface, different from that of an adjacent tier.

9. The method as claimed in claim 6 further comprising attaching the heatsink on the multi-tier substrate over the plurality of integrated circuits with the encapsulant encapsulating the plurality of integrated circuits.

10. The method as claimed in claim 6 wherein:
 forming the heatsink comprises:
  attaching a top integrated circuit on the heatsink;
  attaching a middle integrated circuit on the top integrated circuit;
  attaching a bottom integrated circuit on the middle integrated circuit; and
 attaching connectors comprises:
  mounting bottom connectors of the bottom integrated circuit, middle connectors of the middle integrated circuit, and top connectors of the top integrated circuit with the heatsink thereon, on the multi-tier substrate.

11. An integrated circuit package system comprising:
 a multi-tier laminate substrate having raised pads on each tier and a pad vertical side of the raised pads coplanar with a tier vertical side of each tier; and
 integrated circuits attached on the raised pads with each integrated circuit horizontally nested within the raised pads of the tier above.

12. The system as claimed in claim 11 wherein the plurality of integrated circuits comprises a plurality of flipchip integrated circuits.

13. The system as claimed in claim 11 wherein the multi-tier substrate comprises a tier of the multi-tier substrate having a height from a base of the multi-tier substrate and a width of a mounting surface, different from that of another tier.

14. The system as claimed in claim 11 further comprising an encapsulant over a structure on the multi-tier substrate and over the plurality of integrated circuits.

15. The system as claimed in claim 11 wherein each of the plurality of integrated circuits is attached to another of the plurality of integrated circuits.

16. The system as claimed in claim 11 wherein:
 the multi-tier substrate having a plurality of tiers;
 a heatsink having the plurality of integrated circuits attached thereto in tiers; and
 the connectors of the plurality of integrated circuits on the plurality of tiers.

17. The system as claimed in claim 16 wherein the connectors comprise solder bumps of a plurality of flipchip integrated circuits.

18. The system as claimed in claim 16 wherein the multi-tier substrate comprises the plurality of tiers having a height from a base of the multi-tier substrate and width of a mounting surface, different from that of an adjacent tier.

19. The system as claimed in claim 16 further comprising the heatsink on the multi-tier substrate over the plurality of integrated circuits with the encapsulant encapsulating the plurality of integrated circuits.

20. The system as claimed in claim 16 wherein:
 the heatsink comprises:
  a top integrated circuit on the heatsink;
  a middle integrated circuit on the top integrated circuit;
  a bottom integrated circuit on the middle integrated circuit; and
 the connectors comprise:
  bottom connectors of the bottom integrated circuit, middle connectors of the middle integrated circuit, and top connectors of the top integrated circuit with the heatsink thereon, on the multi-tier substrate.

* * * * *

UNITED STATES PATENT AND TRADEMARK OFFICE
CERTIFICATE OF CORRECTION

| | | |
|---|---|---|
| PATENT NO. | : 7,977,579 B2 | Page 1 of 1 |
| APPLICATION NO. | : 11/278070 | |
| DATED | : July 12, 2011 | |
| INVENTOR(S) | : Bathan et al. | |

It is certified that error appears in the above-identified patent and that said Letters Patent is hereby corrected as shown below:

Column 4:
line 35, delete "ton pad" and insert therefor --top pad--
line 36, delete "to tier" and insert therefor --top tier--
line 37, delete "ton tier" and insert therefor --top tier--

Signed and Sealed this
Twenty-fourth Day of April, 2012

David J. Kappos
*Director of the United States Patent and Trademark Office*